(12) United States Patent
Wang et al.

(10) Patent No.: US 8,879,223 B2
(45) Date of Patent: Nov. 4, 2014

(54) INTEGRATED EMI FILTER CIRCUIT WITH ESD PROTECTION AND INCORPORATING CAPACITORS

(71) Applicant: Citruscom Corporation, Grand Cayman (KY)

(72) Inventors: Albert Z. Wang, Grand Cayman (KY); Wen-Chin Wu, Grand Cayman (KY); Nan Zhang, Grand Cayman (KY); Shijun Wang, Grand Cayman (KY)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 81 days.

(21) Appl. No.: 13/742,116

(22) Filed: Jan. 15, 2013

(65) Prior Publication Data

US 2014/0198417 A1 Jul. 17, 2014

(51) Int. Cl.
*H02H 9/04* (2006.01)
(52) U.S. Cl.
CPC ................................ *H02H 9/045* (2013.01)
USPC .......................................................... 361/56
(58) Field of Classification Search
CPC .... H02H 9/045; H03H 7/0107; H03H 7/1766
USPC .......................................................... 361/56
See application file for complete search history.

(56) References Cited

U.S. PATENT DOCUMENTS

| | | | | |
|---|---|---|---|---|
| 7,262,681 B2* | 8/2007 | Hurley | ........................... | 336/200 |
| 7,589,392 B2* | 9/2009 | Shastri et al. | .................. | 257/532 |
| 8,188,572 B2* | 5/2012 | Etter et al. | ..................... | 257/603 |
| 2009/0261897 A1* | 10/2009 | Bobde | ............................ | 327/552 |

OTHER PUBLICATIONS

Data Sheet, California Micro Devices Corp, "LCD & Camera EMI Filter Array with ESD Protection, Preliminary MC1450", 8 pages, Copyright 2005).*

* cited by examiner

*Primary Examiner* — Scott Bauer

(57) ABSTRACT

An integrated electromagnetic interference (EMI) filter circuit with electrostatic discharge (ESD) protection and incorporating capacitors is provided. At least one passive element, i.e. resistor or inductor is connected between an input terminal and an output terminal. A first capacitor is connected between ground and the input terminal, and a second capacitor is connected between ground and the output terminal. A first diode and a second diode are connected in parallel to the first capacitor and the second capacitor. One or multiple parallel capacitors are connected in parallel to the passive element and between the input terminal and the output terminal for frequency compensation by employing the novel EMI LPF circuit, it is extraordinarily advantageous of enhancing its rejection band attenuation and meanwhile maintaining high cut-off frequency while implementation.

16 Claims, 12 Drawing Sheets

INTEGRATED EMI FILTER CIRCUIT WITH ESD PROTECTION AND INCORPORATING CAPACITORS

BACKGROUND OF THE INVENTION

1. Field of the Invention

The present invention relates to an Electromagnetic Interference (EMI) low-pass filter (LPF) integrated circuit (IC), and more specifically to a LPF IC with integrated electrostatic discharge (ESD) protection and incorporating a capacitor network to enhance filter performance.

2. Description of the Prior Art

EMI interferences associated with cellular phones, radios, televisions and other electronic systems widely exist and can seriously affect normal operation of electronic products, especially in high resolution and high data rate electronics such as smart phones, laptops, LCD displays, high-definition TV, digital cameras, etc. To minimize these interferences, EMI LPF filters are widely used in many electronic products to block incoming radio frequency (RF) interferers and noises. On the other hand, electronic systems can generate and emit unwanted RF noises that will affect other electronics. It is hence critical to block any incoming and emitting EMI noises of electronics.

Using EMI filters in data lines and I/O ports is an effective way to block the EMI radiation in both directions by filtering the unwanted RF noises generated from electronic systems and/or occurring in the natural environments. In particular, wireless electronics such as smart phones and LCD are the victims of EMI effect. The data lines linking the main circuit board to the display panel are usually long and very susceptible to high frequency EMI interferers. Meanwhile, any RF noises generated from wireless devices can radiate into the environment through the data lines, which act like antennas. Therefore, the two major tasks for EMI filter are to block any high frequency RF noises and to maintain the base band signal integrity.

LPF is utilized to resolve the above EMI problems. The critical specifications for LPF EMI filter design include low pass-band insertion loss (IL), a broad pass band and high rejection-band attenuation. A low insertion loss in the low pass band ensures the desired baseband signals passing through the LPF filter with minimum signal loss. A broad pass band, defined as the frequency bandwidth from DC (e.g., 1 MHz) to the cut-off frequency ($f_c$) measured at the −3 dB insertion loss point, allows the desired baseband signals with wider frequency spectrum (i.e., lots of useful baseband harmonic signals) to pass through the filter. Generally, a wider pass-band, i.e., a higher $f_c$, enables higher wireless communication data rates. The baseband operation frequency is usually ⅕ to ⅓ of the $f_c$, which guarantees good signal integrity. The rejection-band is determined by the wireless systems, typically from 800 MHz to 6 GHz. The rejection band serves to remove any high-frequency EMI interferers, which are generally associated with the carrier band frequencies in RF systems. To ensure the desired data rates and signal integrity, at least −20 dB attenuation in the rejection-band for the EMI interferes is required in EMI filter circuit designs to ensure the required signal-to-noise ratio (SNR) for the wireless systems.

FIG. 1 illustrates a conventional S-parameter measurement result for the forward transmission gain parameter ($S_{21}$) of an EMI LPF showing its key specifications (i.e., specs), e.g., IL, $f_c$, and rejection band behaviors. The insertion loss curve is always affected by parasitic parameters induced by the package and printed circuit board (PCB), causing the $S_{21}$ curve bounce back in the rejection band.

Traditionally, integrated resistor-capacitor (RC) and inductor-capacitor (LC) filters are used as EMI filters. Such EMI filters usually incorporate integrated ESD protection devices to ensure system level transient voltage suppression (TVS) function. FIG. 2A and FIG. 2B show the two ideal π-type CRC and CLC EMI LPF filter circuits, respectively. FIG. 3A and FIG. 3B illustrate these two CRC and CLC EMI filter circuits with integrated ESD protection, which are Zener diodes in the examples where the anodes are connected to the input and output nodes, respectively, and the cathodes are grounded. The parasitic capacitance of the ESD diodes contribute to the two capacitors required, which requires careful design balance between the required capacitance values and the ESD diode sizes for given ESD protection level. The Zener diode ESD protection devices can be replaced by any other type of ESD protection structures in practical designs.

As a result, the basic EMI filters cannot deliver strong rejection band attenuation and very high $f_c$ to ensure excellent baseband signal integrity due to LPF filter design trade-offs. This is because, in practical LPF filter designs, to achieve the required low insertion loss and broad pass-band, while obtaining high rejection-band attenuation, are in conflict and challenging. Particularly, the $S_{21}$ curve should have a very clean and high $f_c$ and a fast roll-off attenuation curve, i.e., a steep $S_{21}$ roll-off curvature after the designed $f_c$ point. The conventional single-stage CRC and CLC filters shown in FIGS. 2A, 2B, 3A and 3B cannot achieve these requirements due to various IC and package parasitic effects. Alternatively, multiple-stage CRC and CLC EMI filter circuits may improve the rejection band attenuation while achieving high $f_c$. FIG. 4A and FIG. 4B depict examples of two-stage CRC and CLC LPF circuits for this purpose, respectively. The extra frequency poles introduced by the extra capacitors and inductors in the LPF circuits can be fine-tuned to compensate frequency behaviors, hence to achieve the required $f_c$, sharper roll-off curve and better rejection band attenuation. Similarly, higher-order multiple-stage LPF filter circuits can further improve the EMI filter performance through frequency compensation. Unfortunately, a multiple-stage LPF filter requires extra components, including resistors, capacitors or inductors, resulting in fast increase of the EMI LPF filter size, which is undesired for most small footprint electronics, such as smart phones.

On account of above, it should be obvious that there is indeed an urgent need for a new EMI circuit which can enhance the rejection band attenuation, while maintaining high $f_c$ and yet without increase of the filter size when using an EMI LPF filter.

SUMMARY OF THE INVENTION

In order to overcome the above-mentioned disadvantages, an approach in accordance with the present invention is provided for a new EMI LPF filter IC incorporating at least one parallel capacitor, which enhances the rejection band attenuation, while maintaining high $f_c$. According to the present invention, the new EMI circuit may be applied to π-type capacitor-resistor-capacitor (CRC) filters and/or π-type capacitor-inductor-capacitor (CLC) filters of various formats.

In one aspect, the EMI LPF circuit incorporating ESD protection of the present invention comprises: at least one passive element, a first capacitor and a second capacitor, a first diode and a second diode, and at least one parallel capacitor.

The at least one passive element is connected between an input terminal and an output terminal. The first capacitor is connected between ground and a node of the at least one passive element and the input terminal, and the second capacitor is connected between ground and a node of the at least one passive element and the output terminal. An anode and a cathode of the first diode are respectively connected to the input terminal and ground, and an anode and a cathode of the second diode are respectively connected to the output terminal and ground. The first capacitor, the second capacitor, the first diode and the second diode are connected in parallel.

The at least one parallel capacitor is connected in parallel to the at least one passive element and between the input terminal and the output terminal for frequency compensation.

According to one embodiment of the present invention, the at least one passive element can be an inductor or a resistor.

According to one embodiment of the present invention, the at least one parallel capacitor can be a metal-oxide-semiconductor (MOS) capacitor, a polysilicon-insulator-polysilicon (PIP) capacitor, or a metal-insulator-metal (MIM) capacitor.

A physical layout for the at least one parallel capacitor can be made in various ways, for example, a lateral metal-metal finger capacitor and/or a vertical metal-metal overlap capacitor.

According to one embodiment of the present invention, when the LPF EMI filter is applied to a two-stage CRC circuit, it further comprises a third capacitor and a third diode, wherein two resistors are connected in series between the input terminal and the output terminal, the third capacitor is connected between ground and a node of the first resistor and the second resistor, and an anode and a cathode of the third diode are respectively connected to the node of the first resistor and the second resistor and ground.

According to one embodiment of the present invention, when the LPF EMI filter is applied to a three-stage CRC/CLC circuit, it further comprises a third capacitor and a fourth capacitor, wherein three resistors/inductors are connected in series between the input terminal and the output terminal, the third capacitor is connected between ground and a node of the first resistor/inductor and the second resistor/inductor, and the fourth capacitor is connected between ground and a node of the second resistor/inductor and the third resistor/inductor.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
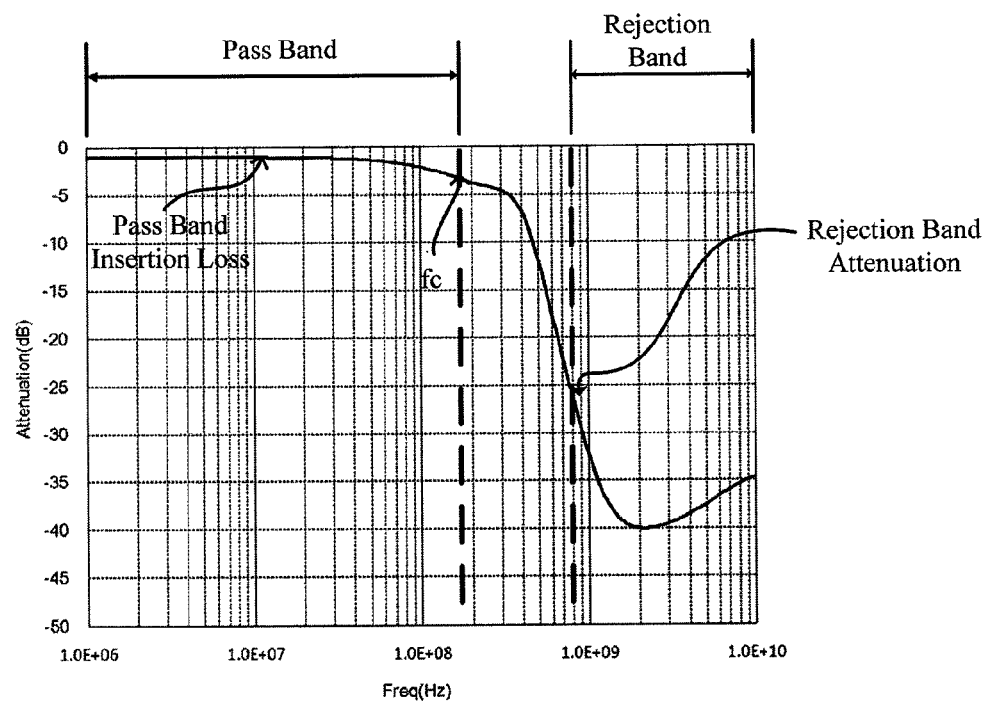
FIG. 1 shows a typical $S_{21}$ curve for a traditional EMI LPF filter.
Figure 2A:
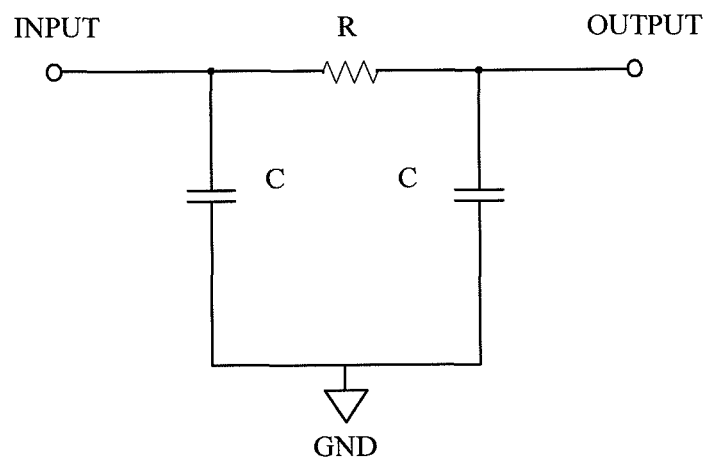
FIG. 2A shows a schematic view of conventional π-type CRC EMI LPF filter circuit.
Figure 2B:
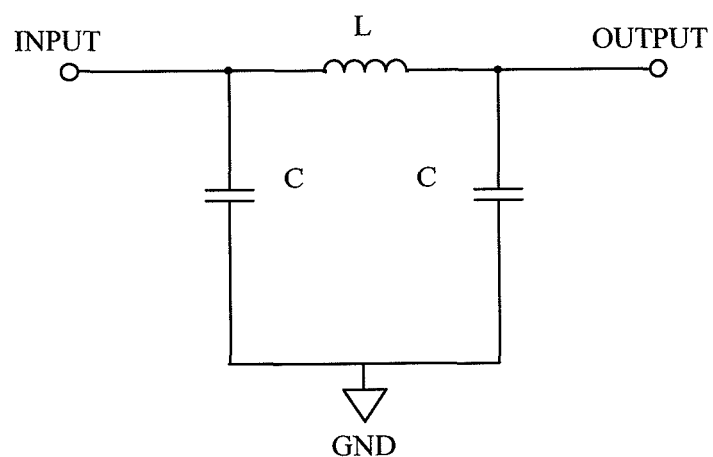
FIG. 2B shows a schematic view of conventional π-type CLC EMI LPF filter circuit.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In order to achieve the purpose of good rejection band attenuation and steep roll-off at high $f_c$, the proposed structure of the present invention provides a novel EMI LPF IC filter, which incorporates at least one parallel capacitor such that the EMI LPF IC incorporating capacitors can be applied to single-stage and/or multiple-stage CRC and CLC circuits in different schematics, and meanwhile maintaining excellent ESD protection.

Figure 5:
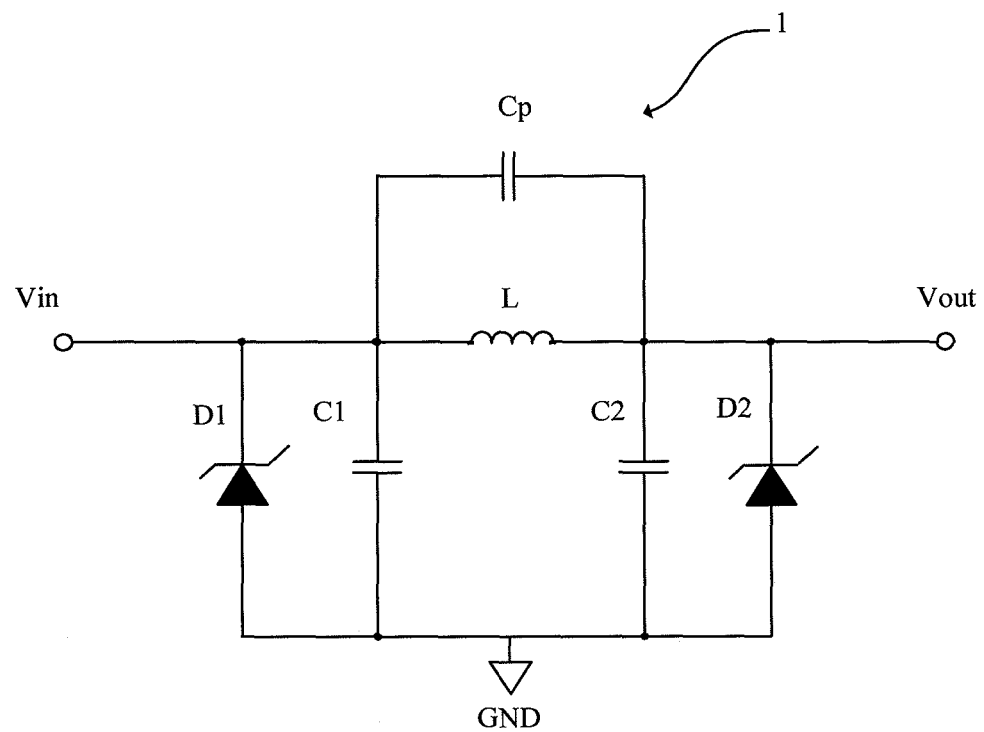
FIG. 5 shows a schematic view of an EMI LPF filter circuit incorporating ESD protection implemented in a single-stage CLC schematic in accordance with one embodiment of the present invention.

Refer to FIG. 5, which shows an EMI LPF filter circuit incorporating ESD protection implemented in a single-stage CLC schematic in accordance with one embodiment of the present invention.

The EMI LPF filter circuit 1 of the first embodiment includes two ESD protection diodes D1 and D2, two capacitors C1 and C2, a parallel capacitor Cp, and a passive element connected between an input terminal Vin and an output terminal Vout. In the first embodiment of the present invention, the passive element connected between the input terminal Vin and the output terminal Vout is a channel inductor L, hence forming a CLC type EMI filter. In other embodiments of the present invention, the passive element can also be implemented by using a resistor or more resistors to form a CRC type EMI filter. The explanatory schematic (FIG. 5) is not intended to limit the scope of the present invention. Any equivalent modification or variation, i.e. replacing the inductor with a resistor according to the spirit of the present invention is to be also included within the scope of the present invention.

According to the first embodiment of the present invention, D1 can be a Zener diode with its anode connected to the input terminal Vin and cathode connected to the ground. D2 is a Zener diode with its anode connected to the output terminal Vout and the cathode connected to the ground. The parasitic capacitance of D1 and D2 contribute to the two required capacitors C1 and C2 of the EMI filter. The first capacitor C1 is connected between the ground and a node of the inductor L and the input terminal Vin. The second capacitor C2 is connected between the ground and a node of the inductor L and the output terminal Vout. The two ESD protection diodes D1, D2 and the two capacitors C1, C2 are connected in parallel.

The parallel capacitor Cp is connected in parallel to the inductor L and also between the input terminal Vin and the output terminal Vout. In one embodiment, the parallel capacitor Cp can be formed as a MOS capacitor, a PIP capacitor, or a MIM capacitor. And, a physical layout for the parallel capacitor Cp can be made in various ways including a lateral metal-metal finger capacitor or a vertical metal-metal overlap capacitor. The input and output terminals are connected to a package lead-frame by bonding wires. The ESD diodes must be isolated from each other and any other components.

Figure 3A:
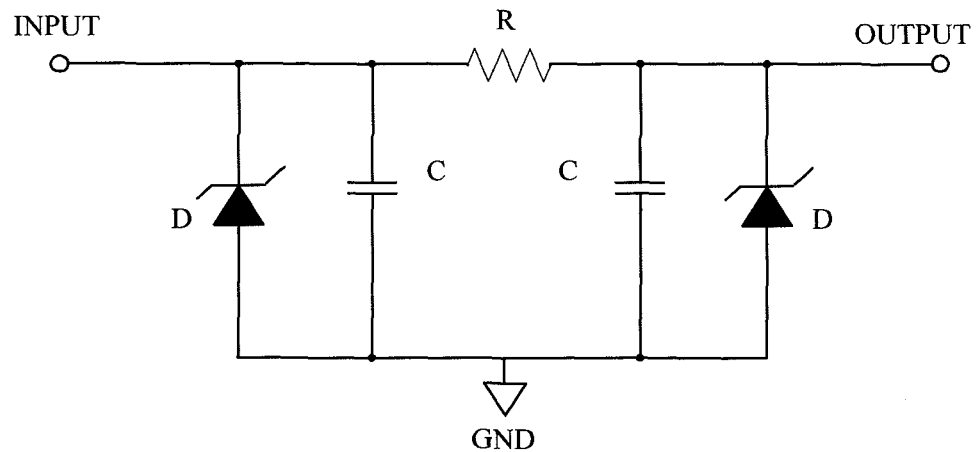
FIG. 3A shows a schematic view of the conventional π-type CRC EMI LPF filter circuit with integrated ESD protection Zener diode.
Figure 3B:
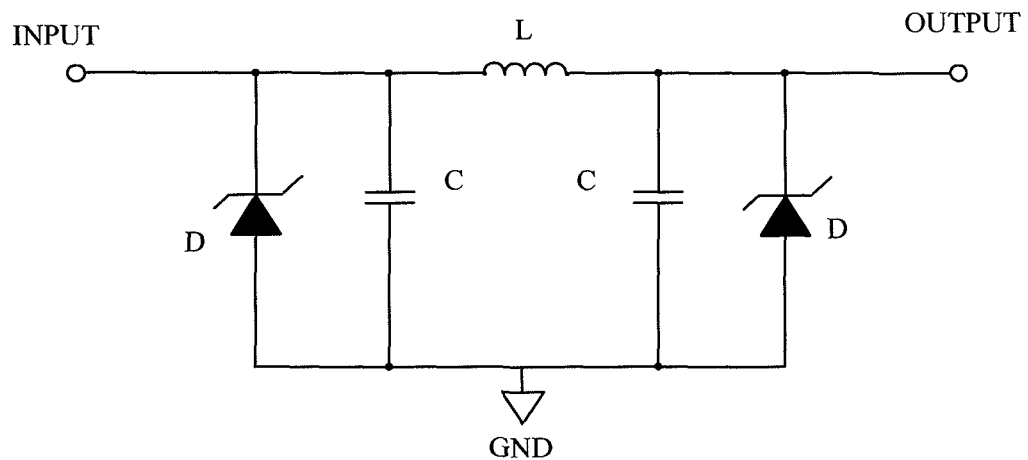
FIG. 3B shows a schematic view of the conventional π-type CLC EMI LPF filter circuit with integrated ESD protection Zener diode.
Figure 6:
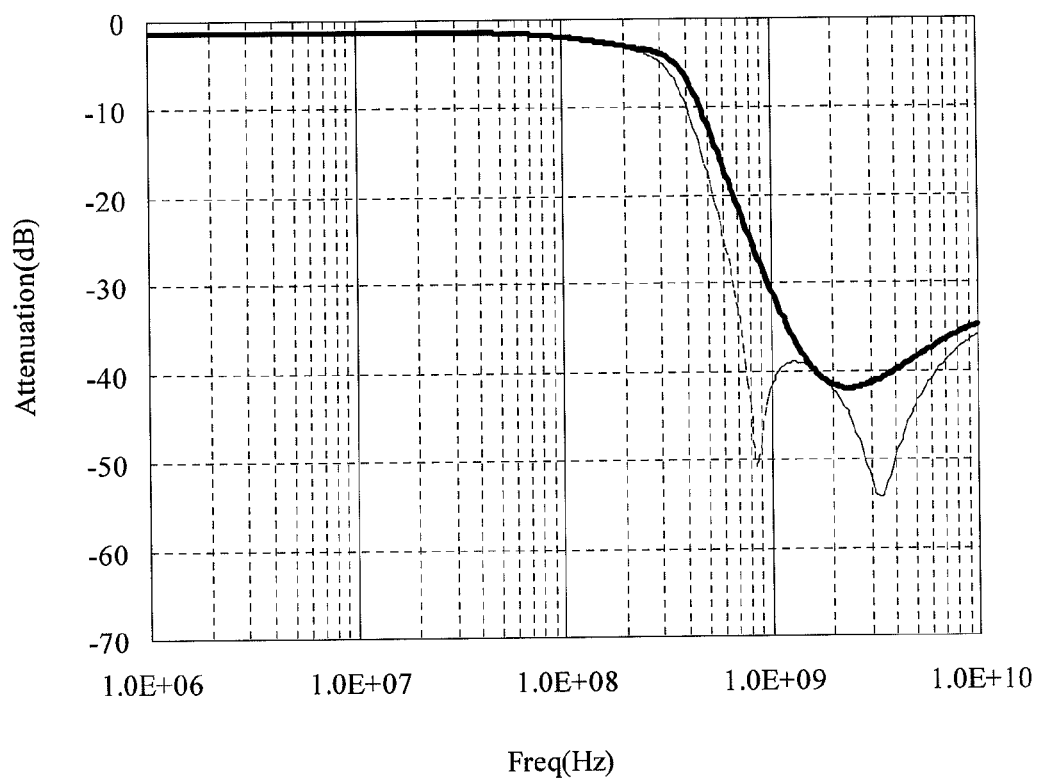
FIG. 6 is a drawing which compares the $S_{21}$ characteristics of the single-stage CLC EMI filter shown in FIG. 5 with its counterpart without using the parallel capacitor in FIG. 3B.

FIG. 6 compares the $S_{21}$ characteristics of the new single-stage CLC EMI filter shown in FIG. 5 with its counterpart without using the parallel capacitor Cp in FIG. 3B, wherein the thick line indicates the $S_{21}$ characteristics of FIG. 3B, while the thin line indicates the $S_{21}$ characteristics of FIG. 5.

The input signal coming to the input terminal Vin passes through the LPF filter to the output terminal Vout with minimum low-frequency insertion loss (IL) within the pass band. The pass band covers the frequency spectrum from DC to $f_c$, corresponding to the −3 dB drop-off point. Good signal integrity typically requires the base band operation frequency ranges from ⅕ to ⅓ of the $f_c$. Consequently, any incoming signal with the frequency higher than $f_c$ will be blocked by the LPF filter due to rejection band attenuation. The rejection band attenuation should be at least −20 dB to achieve the desired high SNR ratio.

As shown in FIG. 6, it is clear that, due to frequency compensation by the Cp, the proposed EMI LPF circuit 1 of the present invention achieves much improved high-frequency rejection band attenuation without affecting its low-frequency insertion loss, i.e., the attenuation over the rejection band from 800 MHz to 6 GHz is significantly steeper while the $f_c$ stays unchanged. By carefully tuning the inductor L1 and the parallel capacitor Cp, a suitable resonant frequency point can be selected to tune the lowest point of rejection band.

Figure 7A:
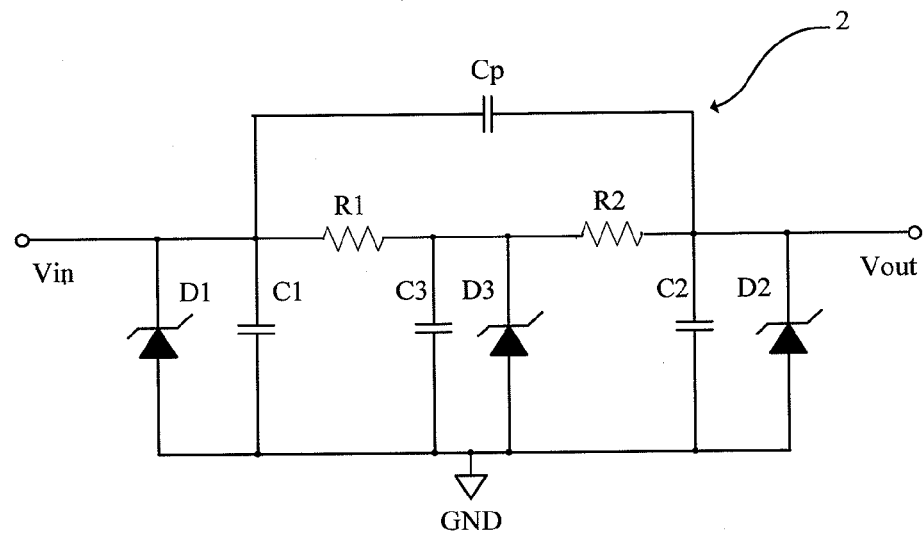
FIG. 7A shows a schematic view of an EMI LPF filter circuit incorporating ESD protection implemented in a two-stage CRC schematic in accordance with one embodiment of the present invention.

Refer to FIG. 7A for the second embodiment of the present invention, which shows an EMI LPF filter circuit incorporating ESD protection implemented in a two-stage CRC schematic in accordance with one embodiment of the present invention.

The EMI LPF filter circuit 2 of the second embodiment includes three ESD protection diodes D1, D2 and D3, three capacitors C1, C2 and C3, a parallel capacitor Cp, and two passive elements connected between an input terminal Vin and an output terminal Vout. In the second embodiment of the present invention, the two passive elements connected between the input terminal Vin and the output terminal Vout are a first resistor R1 and a second resistor R2 which connects in series with the first resistor R1, forming CRC type EMI filters. Similar to the first embodiment, the passive elements defined in the second embodiment can also be implemented by using an inductor or more inductors to form CLC type EMI filters. The explanatory schematic (FIG. 7A) is not intended to limit the scope of the present invention. Any equivalent modification or variation, i.e. replacing the resistors with inductors according to the spirit of the present invention is to be also included within the scope of the present.

According to the second embodiment of the present invention, D1 is a Zener diode with its anode connected to the input terminal Vin and cathode connected to the ground. D2 is a Zener diode with its anode connected to the output terminal Vout and the cathode connected to the ground. D3 is a Zener diode with its anode connected to a node of the first resistor R1 and the second resistor R2, and the cathode connected to the ground. The parasitic capacitance of D1, D2 and D3 contribute to the three required capacitors C1, C2 and C3 of the EMI filter, wherein C1 is connected between the ground and a node of the first resistor R1 and the input terminal Vin; C2 is connected between the ground and a node of the second resistor R2 and the output terminal Vout; and C3 is connected between the ground and a node of the first resistor R1 and the second resistor R2. The ESD protection diodes D1, D2, D3 and the three capacitors C1, C2, C3 are connected in parallel.

The parallel capacitor Cp is connected in parallel to the first and second resistors R1, R2 and between the input terminal Vin and the output terminal Vout. In one embodiment, the parallel capacitor Cp can be formed as a MOS capacitor, a PIP capacitor, or a MIM capacitor, and a physical layout for the parallel capacitor Cp can be made in various ways including a lateral metal-metal finger capacitor or a vertical metal-metal overlap capacitor.

In this embodiment, when ESD transients occur to the input terminal Vin, the high ESD current will be shunted by the three ESD protection diodes D1, D2 and D3 to protect the internal circuit. Because of the resistors R1 and R2 in the channel between input and output terminals, the majority of the ESD surge will discharge into the ground through D1. The output voltage will be clamped to a safe level by the ESD protection diodes. Compared to a traditional single-stage EMI LPF filter, this two-stage EMI LPF filter provides better ESD protection to internal circuits while maintaining the same channel resistance and capacitance. For a single-stage CRC filter, though the majority ESD current discharges through the first ESD protection diode, a sizable residue current will pass through the second ESD diode and determines the critical output clamping voltage. However, according to the new two-stage CRC LPF filter of the present invention, the first two ESD protection diodes (D1, D3) serve to discharge the large ESD current surge and the residue ESD current passing through the third ESD protection (D2) can be significantly reduced, therefore, the output clamping voltage will be much lower, which is one major advantage of the new two or multi-stage EMI filter circuits.

Figure 4A:
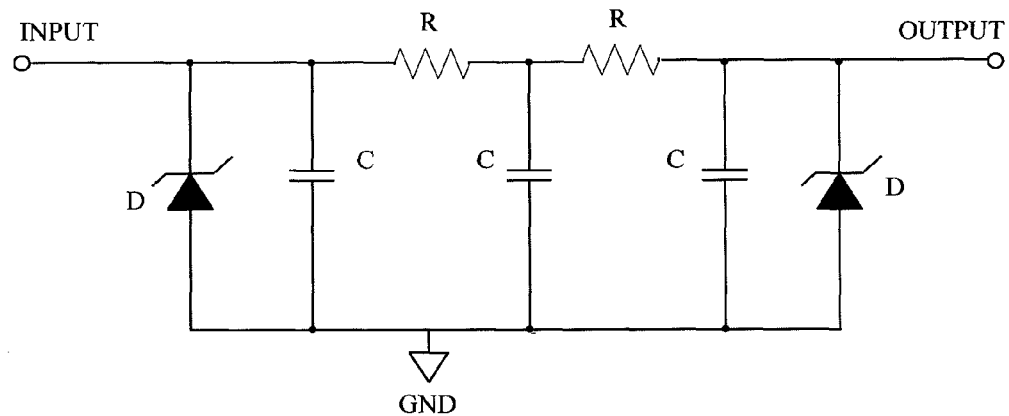
FIG. 4A shows a schematic view of the conventional two-stage CRC EMI LPF filter circuit with integrated ESD protection Zener diode.
Figure 4B:
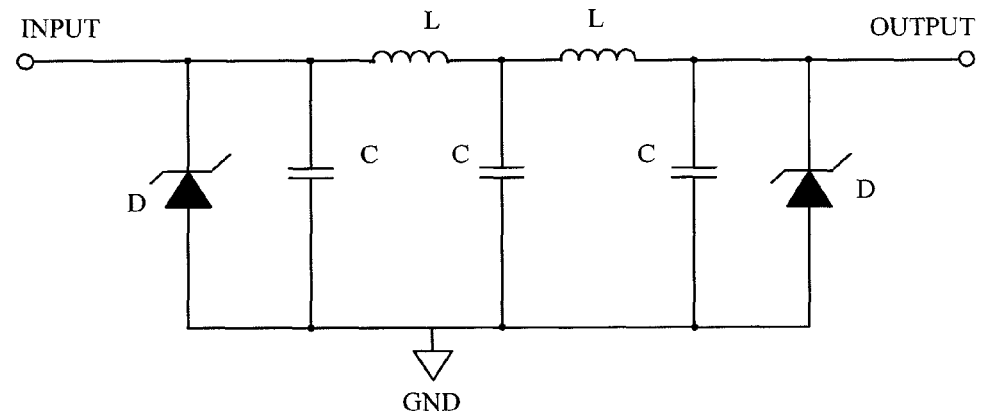
FIG. 4B shows a schematic view of the conventional two-stage CLC EMI LPF filter circuit with integrated ESD protection Zener diode.
Figure 8:
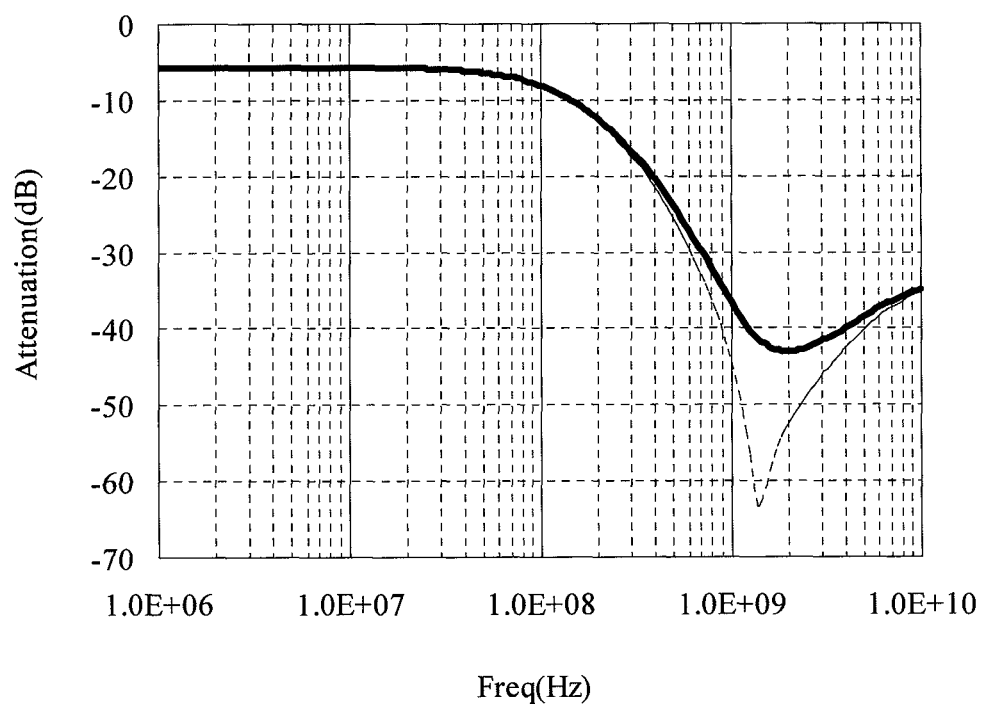
FIG. 8 is a drawing which compares the $S_{21}$ characteristics of the EMI LPF filter in FIG. 7A with its counterpart without using the parallel capacitor in FIG. 4A.

FIG. 8 compares the $S_{21}$ characteristics of the new EMI LPF filter in FIG. 7A with its counterpart without using the parallel Cp in FIG. 4A, wherein the thick line indicates the $S_{21}$ characteristics of FIG. 4A, while the thin line indicates the $S_{21}$ characteristics of FIG. 7A. As shown in FIG. 8, it is clear that, due to frequency compensation by the parallel capacitor Cp, the new EMI filter achieves much improved high-frequency rejection band attenuation without affecting its low-frequency insertion loss, i.e., the attenuation over the rejection band from 800 MHz to 6 GHz is significantly steeper while the $f_c$ stays unchanged.

Figure 7B:
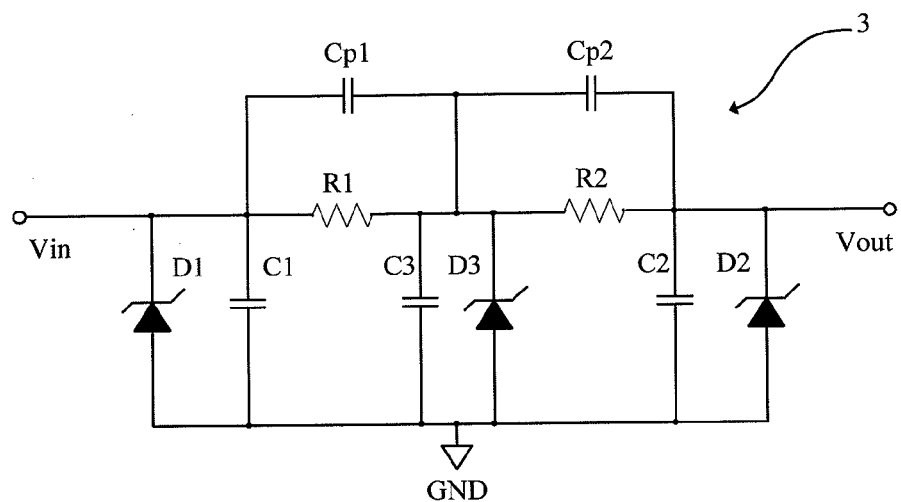
FIG. 7B shows a schematic view of an EMI LPF filter circuit incorporating ESD protection implemented in a two-stage CRC schematic in accordance with another embodiment of the present invention.

Moreover, refer to FIG. 7B, which shows a third embodiment of the present invention, illustrating an EMI LPF filter circuit incorporating ESD protection implemented in a two-stage CRC schematic in accordance with another embodiment of the present invention.

In the embodiments of FIG. 7B, the EMI LPF filter circuit implemented in two-stage CRC schematic 3 uses more than one parallel capacitor disposed between the input and output terminal.

As shown in FIG. 7B, the parallel capacitor is implemented by using a first parallel capacitor Cp1 and a second parallel capacitor Cp2, wherein the first parallel capacitor Cp1 is connected to the input terminal Vin and a node of R1 and R2, and the second parallel capacitor Cp2 is connected to the output terminal Vout and the node of R1 and R2. In other words, according to the third embodiment of the present invention, the two parallel capacitors Cp1 and Cp2 can also be used in parallel with each resistor R1 and R2 between the input and output terminal so as to achieve the same objective of the present invention, i.e. an attenuation in rejection band and steep roll-off at high $f_c$.

Figure 9A:
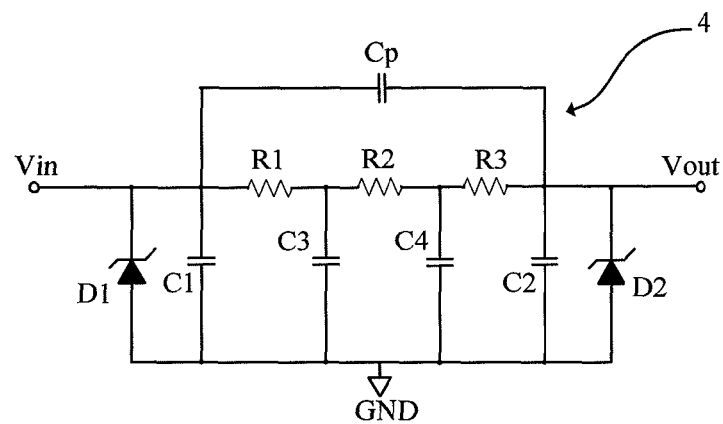
FIG. 9A shows a schematic view of an EMI LPF filter circuit incorporating ESD protection implemented in a three-stage CRC schematic in accordance with one embodiment of the present invention.
Figure 9B:
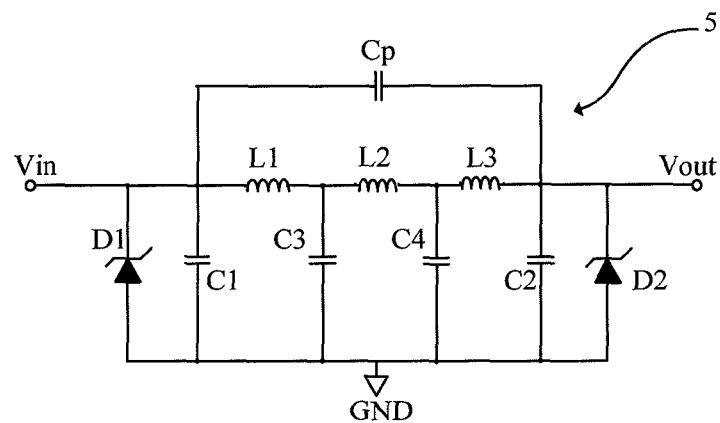
FIG. 9B shows a schematic view of an EMI LPF filter circuit incorporating ESD protection implemented in a three-stage CLC schematic in accordance with one embodiment of the present invention.

Refer to FIG. 9A and FIG. 9B for the fourth and fifth embodiment of the present invention, which respectively shows an EMI LPF filter circuit incorporating ESD protection implemented in a three-stage CRC and CLC schematic in accordance with one embodiment of the present invention.

As shown in the fourth and fifth embodiment of the present invention, the EMI LPF filter circuit 4 and 5 comprises two ESD protection diodes D1 and D2, four capacitors C1, C2, C3 and C4, a parallel capacitor Cp, and three passive elements connected between the input terminal Vin and the output terminal Vout. In the fourth embodiment shown in FIG. 9A, the three passive elements are serially connected resistors R1, R2 and R3. In the fifth embodiment shown in FIG. 9B, the three passive elements are serially connected inductors L1, L2 and L3. According to the present invention, other simple combinations of serially-connected resistors or inductors can also be implemented so that the at least one passive element is composed. The proposed invention is fully described above-mentioned but not limited thereto. In FIGS. 9A and 9B, similar to the previous embodiments, the two diodes D1 and D2 are Zener diodes. The first capacitor C1 is connected between the ground and a node of the first resistor R1 (the first inductor L1 in FIG. 9B) and the input terminal Vin; C2 is connected between the ground and a node of the third resistor R3 (the third inductor L3 in FIG. 9B) and the output terminal Vout; C3 is connected between the ground and a node of the first resistor R and the second resistor R2 (the first inductor L1 and the second inductor L2 in FIG. 9B); and C4 is connected between the ground and a node of the second resistor R2 and the third resistor R3 (the second inductor L2 and the third inductor L3 in FIG. 9B). The ESD protection diodes D1, D2 and the four capacitors C1-C4 are connected in parallel.

Figure 9C:
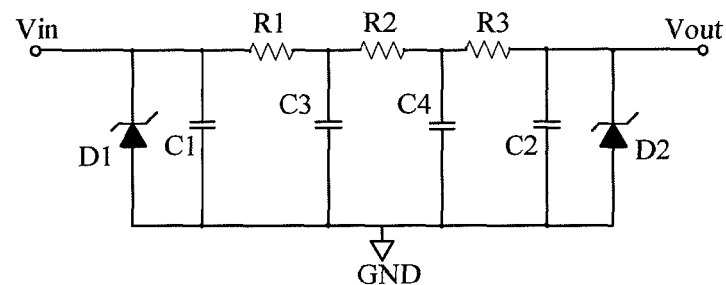
FIG. 9C shows a schematic view of a conventional three-stage CRC EMI LPF filter circuit without using a parallel capacitor.
Figure 10:
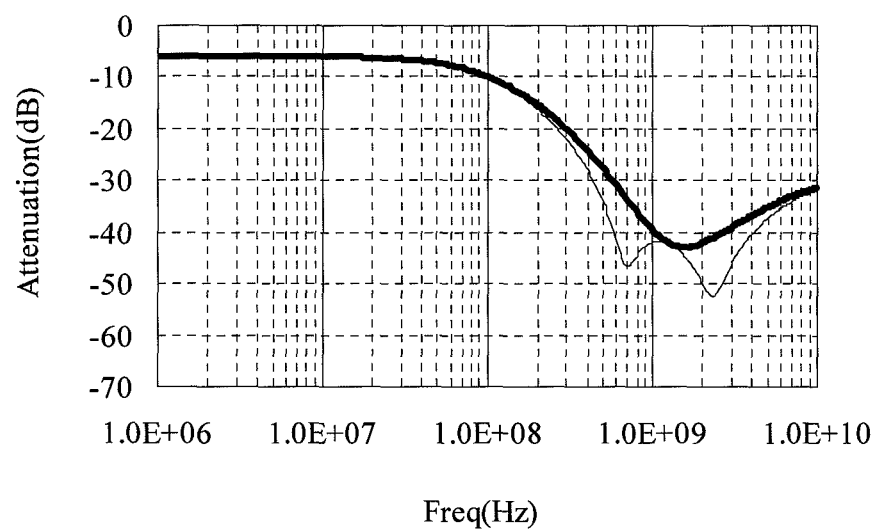
FIG. 10 is a drawing which compares the $S_{21}$ characteristics of the EMI LPF filter in FIG. 9A with its counterpart without using the parallel capacitor in FIG. 9C.

The parallel capacitor Cp is connected in parallel to the resistors R1, R2, R3 (or the inductors L1, L2 and L3 in FIG. 9B) and between the input terminal Vin and the output terminal Vout for frequency compensation. FIG. 10 compares the $S_{21}$ characteristics of the new EMI LPF filter in FIG. 9A with its counterpart without using the parallel Cp in FIG. 9C, wherein the solid thick line indicates the $S_{21}$ characteristics of FIG. 9C while the dotted thin line indicates the $S_{21}$ characteristics of FIG. 9A. According to the present invention, the Cp based frequency compensation serves to significantly improve the rejection band performance without affecting its low-frequency insertion loss. Hence, as shown in FIG. 10, it is apparent that adding the parallel capacitor Cp in the three-stage CRC EMI filter results in much faster high-frequency roll-off speed in the rejection band compared to its counterpart circuit without the Cp shown in FIG. 9C.

Apart from above, other embodiments of the proposed invention consider the use of multiple parallel capacitors between the input and output terminal. These embodiments are shown in FIG. 11A and FIG. 11B, wherein FIG. 11A shows a sixth embodiment of the present invention, illustrating an EMI LPF filter circuit incorporating two parallel capacitors implemented in a three-stage CRC schematic, and FIG. 11B shows a seventh embodiment of the present invention, illustrating an EMI LPF filter circuit incorporating three parallel capacitors implemented in a three-stage CLC schematic.

Figure 11A:
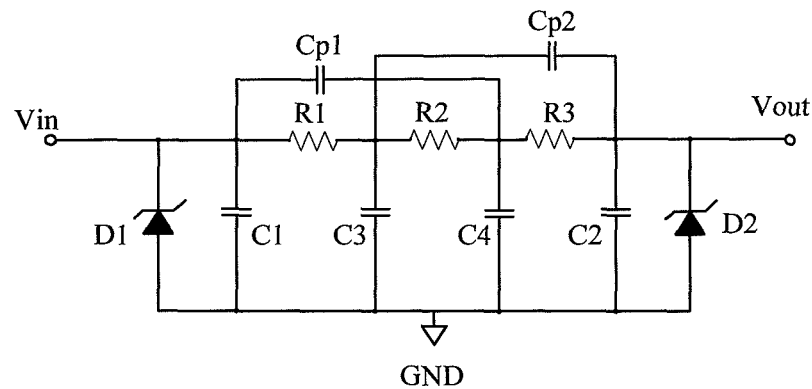
FIG. 11A shows a schematic view of an EMI LPF filter circuit incorporating ESD protection implemented in a three-stage CRC schematic employing two parallel capacitors in accordance with one embodiment of the present invention.
Figure 11B:
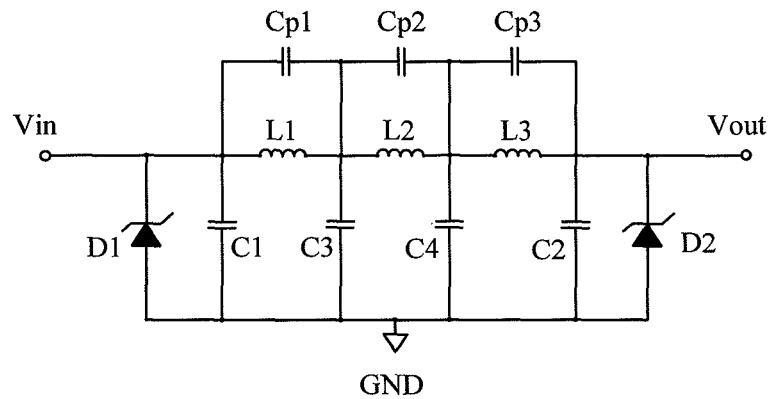
FIG. 11B shows a schematic view of an EMI LPF filter circuit incorporating ESD protection implemented in a three-stage CLC schematic employing three parallel capacitors in accordance with one embodiment of the present invention.

In FIGS. 11A and 11B, the parallel capacitors can be put parallel to one, two or more resistors and/or inductors when applied in a multiple stage CRC and/or CLC EMI filter. According to the embodiment of FIG. 11A, the first parallel capacitor Cp1 is connected to the input terminal Vin and a node of R2 and R3. The second parallel capacitor Cp2 is connected to the output terminal Vout and a node of R1 and R2. By tuning the parameter of different parallel capacitors, its $S_{21}$ curve can also be improved.

Similarly, a distributed multiple parallel capacitor schematic is used to realize the required frequency compensation as shown in FIG. 11B. The first parallel capacitor Cp1 is connected to the input terminal Vin and a node of L1 and L2, the third parallel capacitor Cp3 is connected to the output terminal Vout and a node of L2 and L3, and the second parallel capacitor Cp2 is connected between the first parallel capacitor Cp1 and the third parallel capacitor Cp3. These parallel capacitors can also be formed as MOS capacitors, PIP capacitors, or MIM capacitors, and a physical layout for them can also be made in various ways including lateral metal-metal finger capacitors or vertical metal-metal overlap capacitors as previously mentioned.

Figure 11C:
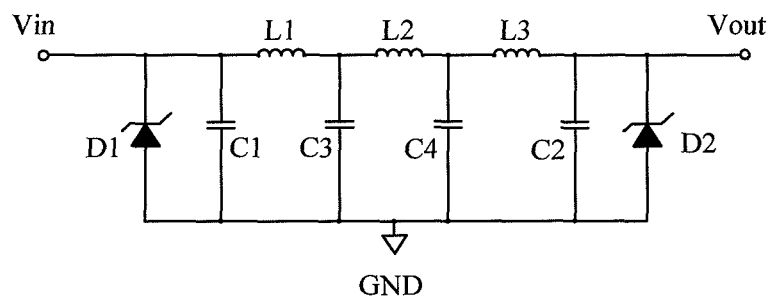
FIG. 11C shows a schematic view of a conventional three-stage CLC EMI LPF filter circuit without using a parallel capacitor.
Figure 12:
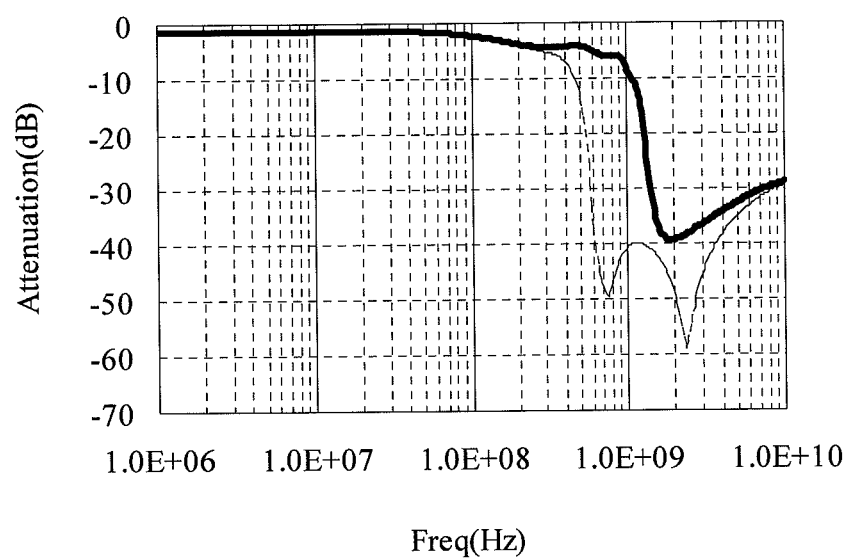
FIG. 12 is a drawing which compares the $S_{21}$ characteristics of the EMI LPF filter in FIG. 11B with its counterpart without using the parallel capacitor in FIG. 11C.

FIG. 12 compares the $S_{21}$ characteristics of the new EMI LPF filter in FIG. 11B with its counterpart without using the parallel Cp in FIG. 11C, wherein the thick line indicates the $S_{21}$ characteristics of FIG. 11C, while the thin line indicates the $S_{21}$ characteristics of FIG. 11B. Compared with the conventional three-stage LC filter shown in FIG. 11C, the rejection band attenuation performance of the present invention is much improved as shown in FIG. 12, and the cut-off frequency is almost not changed.

As a result, to sum up, a novel EMI LPF IC filter incorporating ESD protection has been provided in the present invention to enhance the rejection band attenuation and to maintain high cut-off frequency. By using at least one parallel capacitor connected to a conventional EMI LPF circuit, the Cp based frequency compensation serves to significantly improve its rejection band performance without affecting its low-frequency insertion loss. Moreover, a steep roll-off at high $f_c$ is achieved by employing the present invention. The proposed integrated EMI LPF filter circuit incorporating one or multiple parallel capacitors can be applied to single-stage and/or multiple-stage CRC and CLC circuits in different schematics, and meanwhile maintaining an excellent ESD protection effect. The Zener diode ESD protection devices described as the example in this invention can be replaced by any other type of ESD protection structures in practical designs, for example, a silicon-controlled rectifier (SCR) structure, etc.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An integrated electromagnetic interference (EMI) filter circuit with electrostatic discharge (ESD) protection and incorporating capacitors, comprising:
   a) at least one passive element connected between an input terminal and an output terminal;
   b) a first capacitor and a second capacitor, wherein said first capacitor is connected between ground and said input terminal, and said second capacitor is connected between ground and said output terminal;
   c) a first diode and a second diode, wherein an anode and a cathode of said first diode are respectively connected to said input terminal and ground, an anode and a cathode of said second diode are respectively connected to said output terminal and ground, and said first capacitor, said second capacitor, said first diode and said second diode are connected in parallel;
   d) at least one parallel capacitor connected in parallel to said at least one passive element and between said input terminal and said output terminal for frequency compensation; and
   e) a third capacitor and a fourth capacitor when said at least one passive element comprises first, second, and third passive elements connected in series between said input terminal and said output terminal, wherein said third capacitor is connected between ground and a node of said first and second passive elements, and said fourth capacitor is connected between round and a node of said second and third passive elements, wherein said at least one parallel capacitor comprises a first and second parallel capacitors, said first parallel capacitor being connected to said input terminal and said node of said second and third passive elements, and said second parallel capacitor is connected to said output terminal and said node of said first and second passive elements.

2. The integrated EMI filter circuit of claim 1, wherein said first diode and said second diode comprise at least one of Zener diodes and a silicon-controlled rectifier (SCR) structure.

3. The integrated EMI filter circuit of claim 1, wherein said at least one passive element comprises an inductor.

4. The integrated EMI filter circuit of claim 1, wherein said at least one passive element comprises a resistor.

5. The integrated EMI filter circuit of claim 1, wherein said at least one parallel capacitor comprises at least one of a metal-oxide-semiconductor (MOS) capacitor, a polysilicon-insulator-polysilicon (PIP) capacitor, and a metal-insulator-metal (MIM) capacitor.

6. The integrated EMI filter circuit of claim 1, further comprising a third capacitor and a third diode when said at least one passive element comprises a first passive element and a second passive element, wherein said first passive element and said second passive element are connected in series between said input terminal and said output terminal, said third capacitor is connected between ground and a node of said first passive element and said second passive element, and an anode and a cathode of said third diode are respectively connected to said node of said first passive element and said second passive element and ground.

7. The integrated EMI filter circuit of claim 6, wherein said at least one parallel capacitor further comprises a first parallel capacitor and a second parallel capacitor, said first parallel capacitor is connected to said input terminal and said node of said first passive element and said second passive element, and said second parallel capacitor is connected to said output terminal and said node of said first passive element and said second passive element.

8. The integrated EMI filter circuit of claim 7, wherein said first parallel capacitor and said second parallel capacitor comprise at least one of a MOS capacitor, a PIP capacitor, and a MIM capacitor.

9. The integrated EMI filter circuit of claim 6, wherein said third diode comprises at least one of a Zener diode and a silicon-controlled rectifier (SCR) structure.

10. The integrated EMI filter circuit of claim 6, wherein said first passive element and said second passive element comprise inductors.

11. The integrated EMI filter circuit of claim 6, wherein said first passive element and said second passive element comprise resistors.

12. The integrated EMI filter circuit of claim 1, wherein said first passive element, said second passive element and said third passive element comprise inductors.

13. The integrated EMI filter circuit of claim 1, wherein said first passive element, said second passive element and said third passive elements comprise resistors.

14. The integrated EMI filter circuit of claim 1, wherein said first parallel capacitor and said second parallel capacitor comprise at least one of a MOS capacitor, a PIP capacitor, and a MIM capacitor.

15. The integrated EMI filter circuit of claim 1, wherein said at least one parallel capacitor further comprises a first parallel capacitor, a second parallel capacitor and a third parallel capacitor, said first parallel capacitor is connected to said input terminal and said node of said first passive element and said second passive element, said third parallel capacitor is connected to said output terminal and said node of said second passive element and said third passive element, and said second parallel capacitor is connected between said first parallel capacitor and said third parallel capacitor.

16. The integrated EMI filter circuit of claim 15, wherein said first parallel capacitor, said second parallel capacitor and said third parallel capacitor comprise at least one of a MOS capacitor, a PIP capacitor, and a MIM capacitor.

* * * * *